United States Patent
Litovtchenko et al.

(10) Patent No.: US 10,031,825 B2
(45) Date of Patent: Jul. 24, 2018

(54) ELECTRONIC DEVICE HAVING MULTIPLEXED INPUT/OUTPUT TERMINALS

(71) Applicants: Vladimir Litovtchenko, Ebersberg (DE); Josef Maria Joachim Kruecken, Munich (DE)

(72) Inventors: Vladimir Litovtchenko, Ebersberg (DE); Josef Maria Joachim Kruecken, Munich (DE)

(73) Assignee: NXP USA, Inc., Austin, TX (US)

( * ) Notice: Subject to any disclaimer, the term of this patent is extended or adjusted under 35 U.S.C. 154(b) by 188 days.

(21) Appl. No.: 15/022,495

(22) PCT Filed: Sep. 18, 2013

(86) PCT No.: PCT/IB2013/058638
§ 371 (c)(1),
(2) Date: Mar. 16, 2016

(87) PCT Pub. No.: WO2015/040454
PCT Pub. Date: Mar. 26, 2015

(65) Prior Publication Data
US 2016/0274989 A1 Sep. 22, 2016

(51) Int. Cl.
*G06F 11/00* (2006.01)
*G06F 11/30* (2006.01)
(Continued)

(52) U.S. Cl.
CPC ...... *G06F 11/3051* (2013.01); *G06F 11/2221* (2013.01); *G06F 11/3041* (2013.01);
(Continued)

(58) Field of Classification Search
CPC ............ G06F 11/3051; G06F 11/2221; G06F 11/3041; H03K 5/04; H03K 17/002;
(Continued)

(56) References Cited

U.S. PATENT DOCUMENTS

| 5,317,210 A | 5/1994 | Patel |
| 5,591,910 A | 1/1997 | Lin |

(Continued)

FOREIGN PATENT DOCUMENTS

JP 2009111476 A 5/2009

OTHER PUBLICATIONS

International Search Report for the International application No. PCT/IB2013/058638 dated Jun. 18, 2014.

*Primary Examiner* — Bryce P Bonzo
*Assistant Examiner* — Anthony J Amoroso

(57) ABSTRACT

An electronic device has terminals for interfacing internal signals to other electronic devices. Each terminal is electrically coupled to a terminal driver and a terminal control circuit for receiving a terminal configuration defining the properties and multiplexing of the terminal. The actual configuration of the terminal driver is set according to the terminal configuration. The device has at least one terminal checker arranged for comparing the actual configuration to at least one check configuration, the check configuration defining a configuration of the terminal driver that is either allowed or not allowed, and for, when said comparing indicates a not allowed configuration, setting the actual configuration to a default configuration. Advantageously safe operation of the device in a system is achieved by monitoring the configuration of the multiplexed terminals, and switching to a default configuration when in error.

18 Claims, 6 Drawing Sheets

(51) Int. Cl.
*H03K 19/173* (2006.01)
*G06F 11/22* (2006.01)
*H03K 5/04* (2006.01)
*G01R 31/317* (2006.01)

(52) U.S. Cl.
CPC ........... *H03K 5/04* (2013.01); *H03K 19/1737* (2013.01); *G01R 31/31723* (2013.01)

(58) Field of Classification Search
CPC ..... H03K 2005/00273; H03K 19/1737; H03K 19/1733; H03K 19/17748; G01R 31/31723; G01R 31/31926; G01R 31/31932
See application file for complete search history.

(56) References Cited

U.S. PATENT DOCUMENTS

| | | | |
|---|---|---|---|
| 6,087,852 A | 7/2000 | Briggs et al. | |
| 6,825,689 B1* | 11/2004 | Snyder | G06F 13/4072 |
| | | | 326/37 |
| 7,057,964 B2 | 6/2006 | Hong et al. | |
| 7,285,980 B2 | 10/2007 | Bansal et al. | |
| 7,532,648 B2 | 5/2009 | Sweet | |
| 7,577,038 B2 | 8/2009 | Shin | |
| 8,086,767 B2 | 12/2011 | Lim et al. | |
| 2008/0054938 A1 | 3/2008 | Wojewoda et al. | |
| 2010/0001760 A1 | 1/2010 | Balasubramanian et al. | |
| 2013/0151919 A1* | 6/2013 | Huynh | G06F 1/26 |
| | | | 714/746 |
| 2014/0223078 A1* | 8/2014 | Gravelle | G06F 3/0679 |
| | | | 711/103 |

\* cited by examiner

ELECTRONIC DEVICE HAVING MULTIPLEXED INPUT/OUTPUT TERMINALS

FIELD OF THE INVENTION

This invention relates to electronic devices, such as complex integrated circuits, having multiplexed input/output pads that are configurable for different functions. More specifically, the invention is in the field of providing safe operation of such devices.

BACKGROUND OF THE INVENTION

The United States patent document U.S. Pat. No. 7,285,980 describes a system for multiplexing an integrated circuit pin that includes a plurality of registers for storing setting values for the configuration of the pin. A plurality of functions is to be multiplexed on said pin upon receiving the set values based on decoding the set values for selecting at least one of the functions. A plurality of pads is connected to the plurality of functions and the decoding logic. Thereby external pins act as inputs and/or outputs for the selected functionality depending upon the bit set values.

A problem of such devices is that when an error occurs in the setting of the configuration of the pins by said bit values, other devices coupled to said pins may get stuck or may even be damaged due to the incorrect configuration of the pins. The system in which such device is embedded may enter a potentially unsafe mode.

SUMMARY OF THE INVENTION

The present invention provides an electronic device comprising at least one terminal arrangement for interfacing internal signals in the electronic device to external signals of other electronic devices via a terminal, and a method of providing a safe mode of operation in a system comprising at least one such device, as further described in the accompanying claims.

Specific embodiments of the invention are set forth in the dependent claims. Aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings.

Elements in the figures are illustrated for simplicity and clarity and have not necessarily been drawn to scale. In the figures, elements which correspond to elements already described may have the same reference numerals.

DETAILED DESCRIPTION OF THE PREFERRED EMBODIMENTS

In many applications complex electronic devices are used for safety-oriented functions, for example system on chip (SoC) devices for automotive applications are designed to meet standardized safety requirements. According to such standards a device must be put to a safe state in case of permanent or transient faults. Such protection is insufficient in current devices that have pad control and multiplexing logic for setting the properties and connections of terminals of such devices. Terminals may be pins or pads of an integrated circuit, pins on a connector of a module, etc. Such terminals are coupled to a circuit called terminal driver which determines the properties of the terminal, e.g. being an input and/or an output having selected electrical properties. Also the terminal driver is coupled to some selected internal signal from a range of possible signals, which is commonly called multiplexing. The terminal driver is coupled to the terminal control circuit for setting an actual configuration of the terminal driver according to a terminal configuration. The terminal configuration defines properties of the terminal driver, and, for example, includes a pad configuration defining electrical properties of the terminal driver as experienced by the external signals via the terminal, and/or a multiplexing configuration defining multiplexing properties of the terminal driver for coupling at least one of the internal signals to the terminal. The combination of the terminal, a terminal driver and a terminal control circuit may be called a terminal arrangement. In practice, the terminal control circuits of multiple terminals may be combined in a single control circuit. Detailed examples are provided below.

In a practical example, in today's microcontrollers (MCU) pads connecting the die to the outside world (I/O pads for short) are widely configurable in their electrical behavior (input, output, bi-directional, open-drain, pull-up, pull-down, slew rate, etc). Also the signals of multiple peripherals can share a single pad. The configuration information is typically stored in registers (e.g. D-Flipflops).

Figure 1:
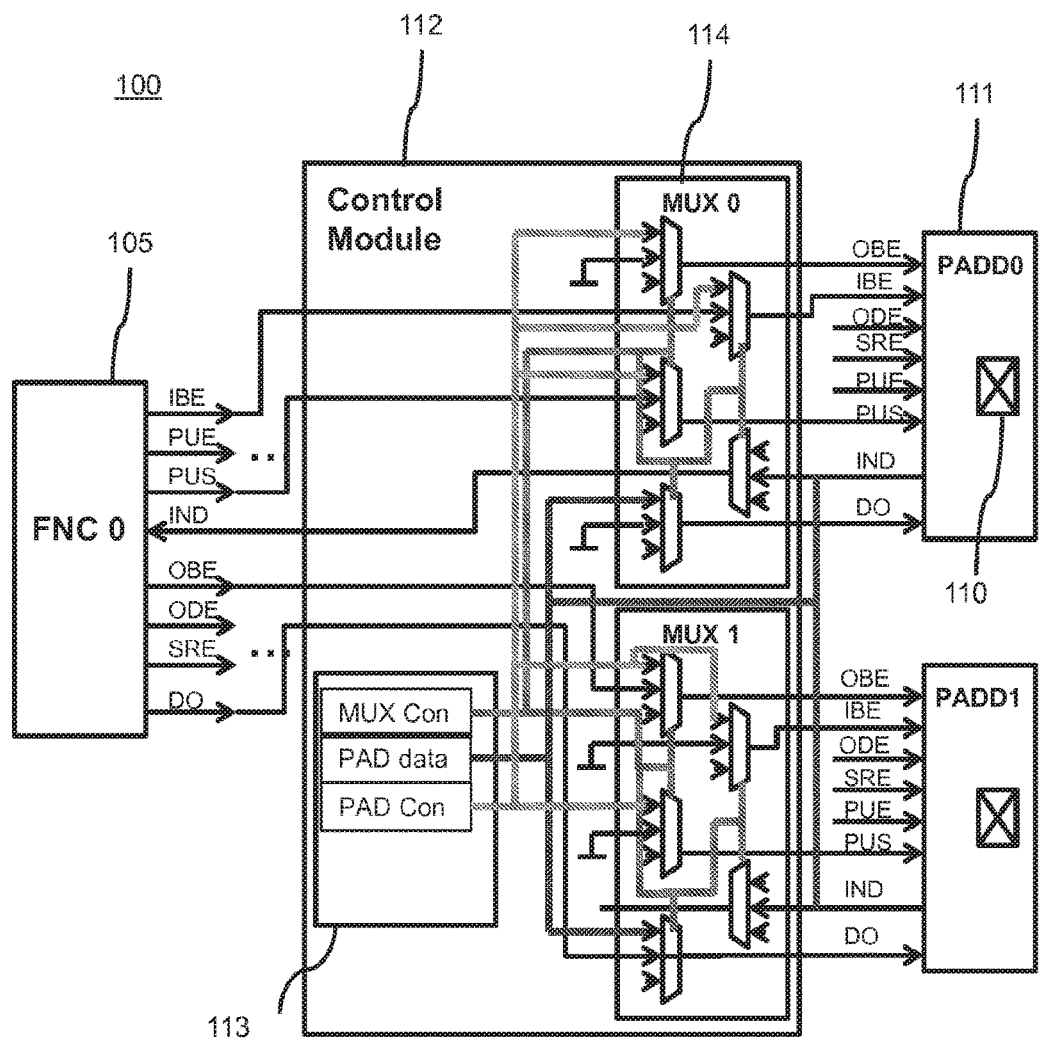
FIG. 1 shows a prior art example of an electronic device having multiplexed terminals.

FIG. 1 shows a prior art example of an electronic device having multiplexed terminals. The device 100 has one or more terminal arrangements, a first terminal arrangement comprising a pad 110 as terminal, a terminal driver 111 marked PADD0 and a terminal control circuit 112 marked control module. The terminal driver may include a multiplexer unit MUX0 114 for setting a multiplexing configuration defining multiplexing properties of the terminal driver for coupling at least one of the internal signals to the terminal. The control unit further has a storage unit 113 which may be a memory or a set of registers. A second terminal and terminal driver PADD1, and multiplexer MUX1 is also shown.

In the storage unit 113 a terminal configuration is stored comprising, for example, setting values "MUX contr" for the multiplexer, and control values for the terminal driver "PAD Contr". Also data values "PAD Data" may be stored when received from the terminal driver on the data input IND. The terminal driver further has an input "DO" for a data output value. The terminal driver may further have one or more mode setting inputs for setting respective electrical properties in the pad configuration, the inputs comprising for example:

Pull Up Enable "PUE", which enables either a pull-up or pull-down internal resistor;

Pull Up Select "PUS", which selects whether pull-up or pull-down is chosen;

Open Drain Enable "ODE", which turns off a high side driver so the terminal has only as active low drive;

Slew Rate Enable "SRE", which enables a control of rise and fall time of an output signal;

Output Buffer Enable "OBE", which makes the terminal an output;

Input Buffer Enable "IBE", which enables a digital input buffer.

The device 100 further comprises at least one function unit "FNC0" 105, which unit performs a required function, well known as such, for example a data processor or memory, or a more complex system function, or a peripheral function. The function unit has at least one input or output to be interface to an external signal via the terminal arrangement. Thereto the function unit provides respective terminal configuration data, and data inputs and or outputs, as indicated in the figure by respective outputs marked similarly to the above mode setting inputs of the terminal driver. When the function unit FNC0 is selected to be coupled to the respective PAD or PADS, said configuration data and input/output data is coupled, via the multiplexer units, to the respective terminal drivers.

As such, the device 100 having the above terminal arrangements that enable a dynamic configuration of the I/O pads, is known. In the further description additional units to the device are discussed. A mis-configuration of I/O pads can lead to serious problems. The following examples illustrate what may happen. An I/O pad configured as input may become an output as the D-Flipflop is hit by noise or cosmic radiation. This I/O pad now drives against the source of the input signal, so that the input true value cannot be read by the device anymore, or even electrical destruction can happen. Another example is that the same pads are shared between a CAN bus and an UART module. The information which module has priority is stored in a D-Flipflop, which may get corrupted. In this example the whole communication to the outside world, for example a car having a CAN bus, can get blocked, which may be unsafe.

As there is no protection in current devices for correct configuration, a software polling the state of the D-Flipflop from time to time might be considered. This however causes software overhead as well as latency until the issue gets detected. Further problems may include:

there are no static checks of pad configuration correctness for settings like pull-enable, pull direction, signal strength, open-drain, etc;

there are no dynamic checks for control signals in case of faults on control lines and/or register data/control: PADs state can change to prohibited states which can lead to application issues or even device damage;

there are no static checks for PAD MUX configuration correctness for on-board peripherals which have requirements/limitations on multiplexing/connection of their inputs and outputs to/from PADs;

there are no dynamic checks for PAD MUX configuration correctness for on-board peripherals in case of failures on the multiplexing control bus.

In this respect static checks are configured to run once, dynamic checks are configured to run continuously. Checks may be enabled to run, e.g. under the control of a processor signal.

Now a hardware based protection scheme is proposed against configuration problems which reacts with low latency time and does not cause software overhead.

Figure 2:
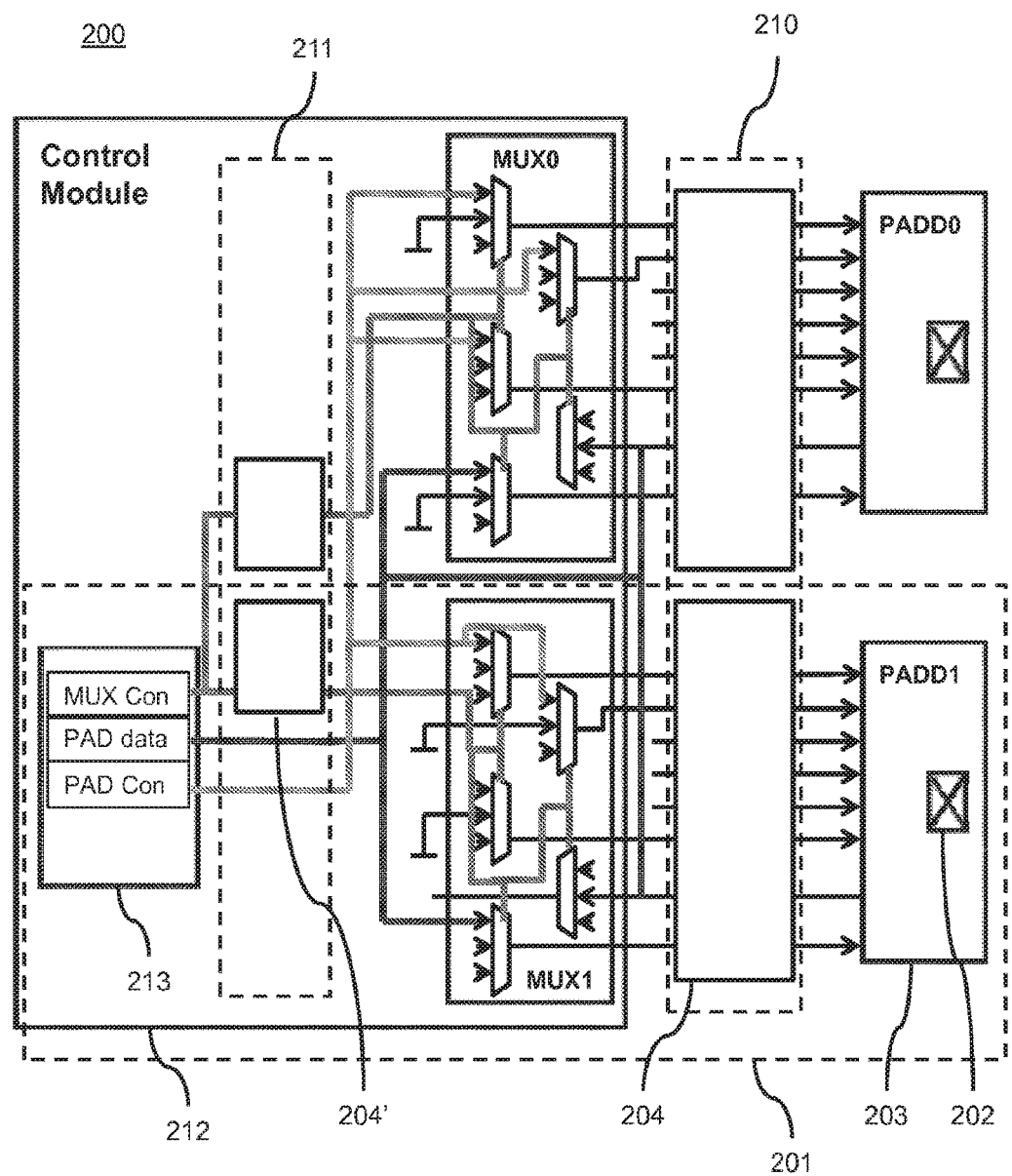
FIG. 2 shows an example of a device having a terminal checker.

FIG. 2 shows an example of a device having a terminal checker. The Figure shows a device 200 similar to the device 100 as described above with reference to FIG. 1, while depicting the corresponding relevant parts of such device.

The device 200 has one or more terminal arrangements 201. The terminal arrangement 201 has a pad 202 as terminal, a terminal driver 203 marked PADD1 and a terminal control circuit 212 marked control module. The terminal arrangement may have a multiplexer unit MUX1 as part of the terminal driver, and a storage unit 213 which may be a memory or a set of registers. A further terminal and terminal driver PADD0, and multiplexer MUX0 are also shown. The control circuit may be shared between terminals.

One or more terminal checkers for respective pads are added to the device described with FIG. 1. In FIG. 2 a terminal checker 204,204' has been added. The terminal checker 204,204' is arranged for comparing the actual configuration of the terminal driver 203 to at least one check configuration. Said check configuration defines a configuration of the terminal driver that is either allowed or not allowed. The checker sets the actual configuration to a default configuration, when said comparing indicates a not allowed actual configuration. In fact the checker overrides the present actual configuration by a predetermined default configuration when an error in the actual configuration is detected.

The terminal checker 204,204' is shown two have two sections, a first section for example constituting a PAD control checker 210 and the second section constituting a multiplexing checker 211. Both sections may either be operated in a static mode (only checking when enabled via a check function, for example performed by a processor) or a dynamic mode (i.e. continuously checking). It is noted that the checker may have only one section, or two or more of such sections; each section being for a specific type of check like multiplexing, input/output mode, electrical properties etc. A respective checker may for example have a multiplexing checker 211 intended to address problems of wrong functional control signals being routed to the pad multiplexer itself, and/or a pad checker 210 intended to check the electrical properties of the pads.

The pad control checker 210 is arranged for comparing the actual configuration to at least one pad configuration comprised in the check configuration. The pad configuration defines electrical properties of the terminal driver as experienced by the external signals via the terminal. When said comparing indicates a not allowed configuration, the checker sets the actual configuration to a default pad configuration comprised in the default configuration.

The multiplex checker 211 is arranged for comparing the actual configuration to at least one multiplex configuration comprised in the check configuration. The multiplexing configuration defines a coupling of one of the internal signals to the terminal. When said comparing indicates a not allowed configuration, the terminal checker sets the actual configuration to a default multiplexing configuration comprised in the default configuration.

Figure 3:
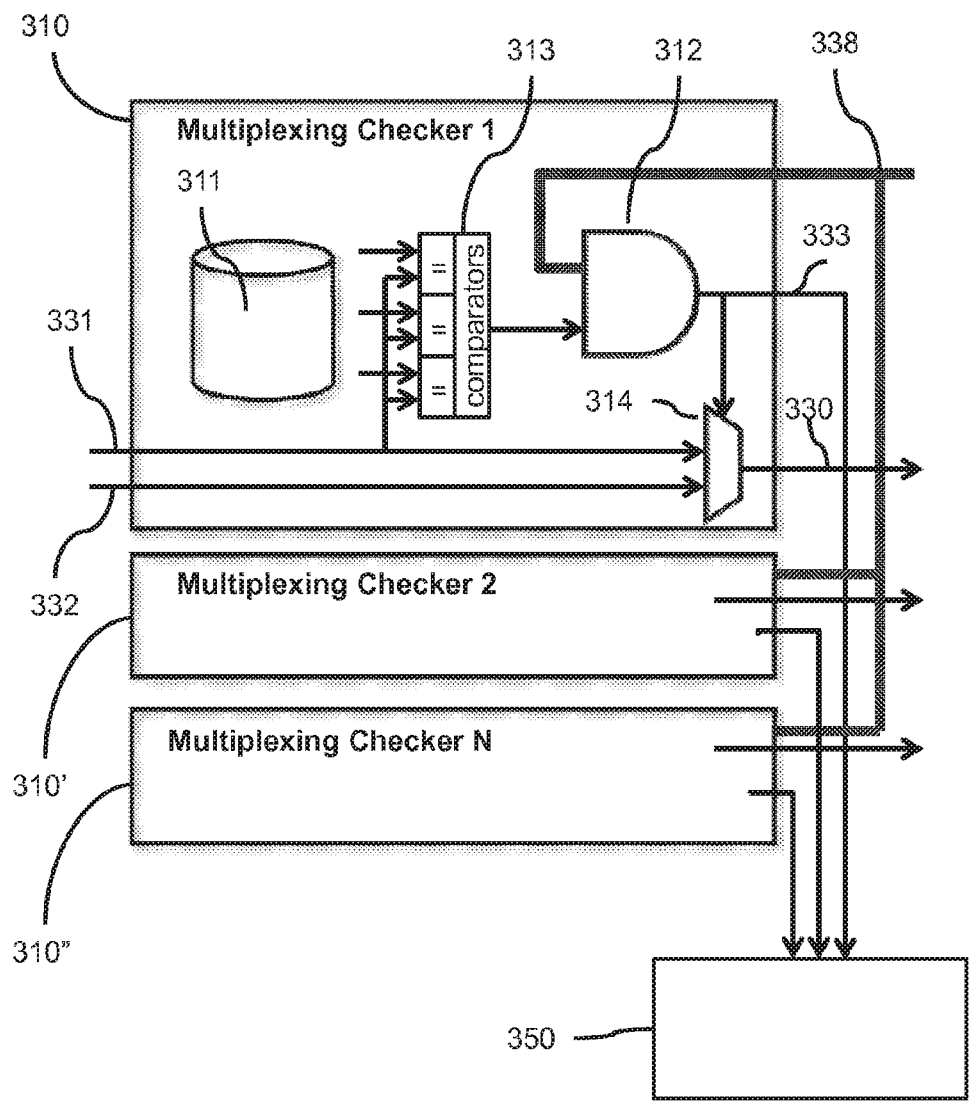
FIG. 3 shows an example of a multiplexing checker.

FIG. 3 shows an example of a multiplexing checker. The figure shows an array of multiplexing checkers marked Checker1 to CheckerN 310,310',310", only the first multiplex checker 310 being shown in detail. The multiplex checker 310 has a configuration input 331 for receiving multiplex control data constituting a multiplex configuration. The multiplex configuration input receives the required actual multiplexing configuration, which defines a coupling of one of the internal signals to the terminal.

The multiplex checker 310 also has a default input 332 for receiving a default multiplexing configuration comprised in the default configuration. Both inputs are coupled to a selector 314 for generating a configuration setting signal 330 to be coupled to the multiplexer unit of the terminal arrangement. The selector is controlled by a compare result signal 333, which indicates whether the configuration is allowed or not allowed. A comparator 313 compares the actual multiplex configuration as indicated by the multiplex control data 331 to one or more multiplex check configurations that are retrieved from a storage unit 311. Alternatively information about the actual multiplex configuration may be provided via an additional input signal. The storage unit 311 stores the multiplex check configurations, which are configurations of the terminal driver that are either allowed or not allowed. For example, for one or more functions in the device, also called peripherals, the storage unit may store a full peripheral pins multiplexing database, having both legal and illegal configurations.

When comparing the actual configuration to a non allowed configuration, a match results in the compare result signal 333 have a logical value indicating a non allowed configuration, i.e. an erroneous condition. Alternatively, when comparing to one or more allowed configurations, a lack of a match will result in the compare result having a logical value indicating a non allowed configuration. A compare result indicating a non allowed configuration selects the default configuration via the selector 314.

Optionally, the device has a fault manager unit 350 coupled to the compare result signals of one or more terminal checkers. The compare result signals 333 as generated by the respective comparators are also outputted to the fault manager unit, which manages errors as detected by the compare result signals.

Optionally, the fault manager unit 350 is arranged for performing the fault management function as follows, upon receiving one or more of the compare result signals indicating a not allowed configuration. First an initialization may be performed by sending the terminal configuration to the terminal control circuit. Also, error handling may include correcting the indicated not allowed configuration and/or storing error data, for example in a log file. Furthermore, a safe mode may be engaged by sending a safe mode terminal configuration to the terminal control circuit. In particular, such a safe mode may be engaged when a specific error repetitively occurs, or after a predetermined number of errors, or upon a further condition as known to the fault manager unit. In practice, the fault manager unit may be build in hardware, e.g. by a state machine, or the fault manager unit may be constituted by a processor programmed for performing the fault management function.

Optionally, in the device the terminal checker comprises a compare enable input for an enable signal 338. Upon receiving the enable signal, said compare result is enabled via a gate 312 to determine the compare result signal and, based thereon, setting the default configuration is enabled via the selector 314. Upon receiving a disable signal, the compare result signal always indicates an allowed configuration, which sets the actual configuration of the terminal driver according to the terminal configuration input data irrespective of said comparing.

In practice, the basic function is to compare (via the comparator 313) the actual multiplexing information (as received via the configuration input 331) with the required configuration stored in an on-chip database 311. This data base may not only store the legal cases, but also illegal ones.

An example of an illegal state, in a CAN bus interface, is as follows. The CAN bus requires that both pads for receive and transmit are connected. So a multiplexing of only one of them to the outside world is considered illegal. An illegal combination defines a number of (control) signal values that may not occur simultaneously. The CAN bus must have two pins: one being the output of the CAN module and the other being the input. The module does not work with only one of them. Now imagine the following scenario: The two signals (TX from transmit and RX for receive) of the CAN module can be routed to pin pairs PA0, PA1 or PB0, PB1. Due to a mistake the only the RX pin is routed from PA1 and PA0 is not connected to the TX pin. This is clearly an illegal situation. A legal situation would be PA0=TX, PA1=RX or PB0=TX, PB1=RX. The routing is controlled by the multiplexer cells as shown in FIGS. 1 and 2. In addition to the routing there are electrical properties associated with a CAN module. For instance the logic level 0 is the active level in CAN communication "1" is the passive. This means that for instance on the input pin (PA1 or PB1) a pull-down is illegal. As multiple inputs control the electrical properties of a pin, multiple signals define the final state of a pin, so various illegal combinations need to be checked. Therefore blocking all possible illegal settings via dedicated hardware is too complex. For example, pins may be shared by other functional modules in the device, for instance a user may decide to route a IIC bus to those pins. IIC has however different signal properties, e.g. both pins must be used in open drain mode. So 2 sets of checkers may be provided, one for IIC use case and the other for the CAN use case. Depending on the use case a different set of properties of the pad will be checked.

The Multiplexing Checkers (Static and dynamic) may be arranged to check if the peripheral pin configuration or multiplexing is done according to the peripheral requirements. Each peripheral pin which needs this check may be provided with a Multiplexing Checker arrangement.

Peripheral pin configuration and/or multiplexing requirements may be captured in a peripheral pins multiplexing database (including legal and illegal ones). The configuration database can be stored in RAM, ROM, DFFs or hardwired in a connection pattern (fixed connections representing 1's or 0's).

The multiplexing check may be run once, e.g. after a configuration step is finished, by a CPU by enabling the compare result. Alternatively, the check may run continuously, by always enabling the compare result. In the event of an incorrect configuration the error may be reported to a CPU or the dedicated fault management module 350. The multiplex configuration is then set to the default value.

Optionally, the terminal checker comprises a pad control checker arranged for comparing the actual configuration to at least one pad configuration comprised in the check configuration. The pad configuration defines electrical properties of the terminal driver as experienced by the external signals via the terminal. When said comparing indicates a not allowed configuration, the terminal checker sets the actual configuration to a default pad configuration comprised in the default configuration.

Figure 4:
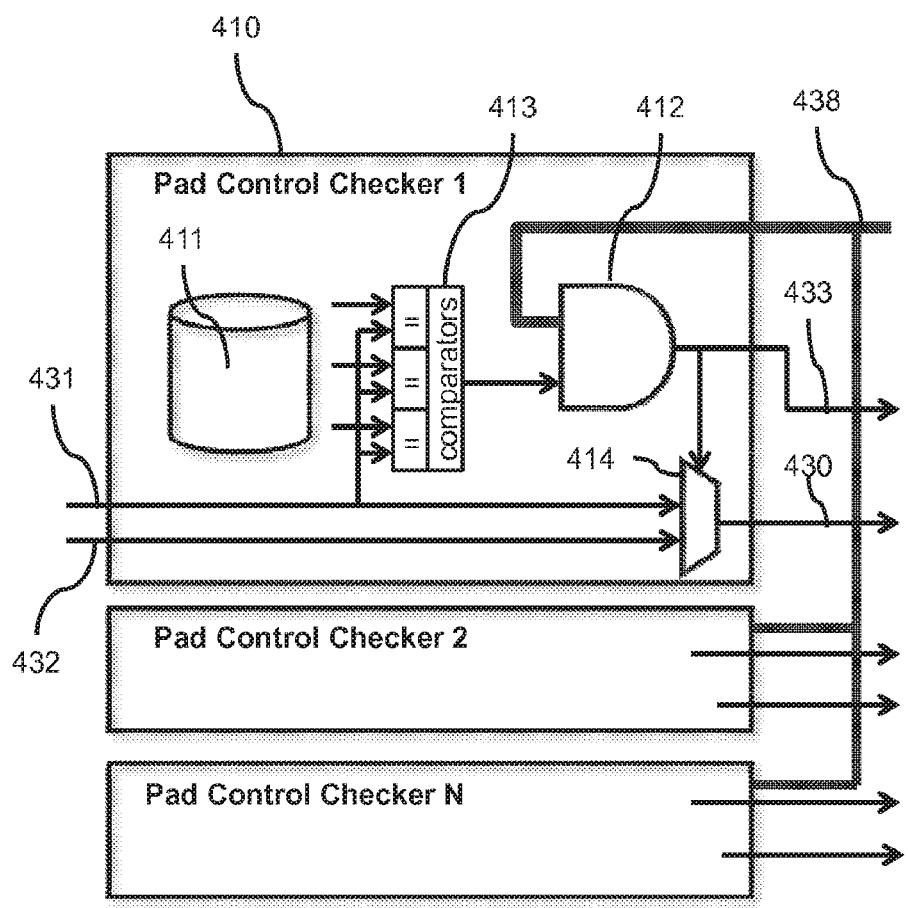
FIG. 4 shows an example of a pad control checker.

FIG. 4 shows an example of a pad control checker. The figure shows an array of pad control checkers marked Pad Control Checker1 to CheckerN, only a first pad control checker 410 being shown in detail. The pad control checker 410 has a configuration input 431 for receiving pad control data constituting a pad configuration. The pad configuration input receives the required actual pad configuration, which defines electrical properties of the terminal driver as experienced by the external signals via the terminal. Actual pad control signal control values may comprise settings like PUE, PUS, ODE, SRE, etc which settings are elucidated above with FIG. 1.

The pad control checker 410 also has a default input 432 for receiving a default pad configuration comprised in the default configuration. Both inputs are coupled to a selector 414 for generating a configuration setting signal 430 to be coupled to the pad control inputs of the terminal driver. The selector is controlled by a compare result signal 433, which indicates whether the configuration is allowed or not allowed. A comparator 413 compares the actual pad configuration as indicated by the pad control data to one or more pad check configurations that are retrieved from a storage unit 411. Alternatively information about the actual pad configuration may be provided via further input signal. The storage unit 411 stores the pad check configurations, which are configurations of the terminal driver that are either allowed or not allowed. For example, for one or more functions in the device, also called peripherals, the storage unit may store a combinations database, having legal and/or illegal configurations of settings of the terminal driver signals.

When comparing the actual configuration to a non allowed configuration, a match results in the compare result signal 433 have a logical value indicating a non allowed configuration, i.e. an erroneous condition. Alternatively, when comparing to one or more allowed configurations, a lack of a match will result in the compare result having a logical value indicating a non allowed configuration. The compare result signal 433 as generated by the comparator 413 may also be outputted to a fault manager unit, as described before with FIG. 3.

Optionally, in the device the terminal checker comprises a compare enable input for an enable signal 438. Upon receiving the enable signal, said compare result is enabled via a gate 412 to determine the compare result signal and, based thereon, setting the default configuration is enabled via the selector 414. Upon receiving a disable signal, the compare result signal always indicates an allowed configuration, which sets the actual configuration of the terminal driver according to the terminal configuration input data irrespective of said comparing.

The Pad control checker shown in FIG. 4 is very similar to the multiplexing checker described above with reference to FIG. 3. An example here for illegal states is to turn on pull-up and a pull-down at the same time causing an unwanted current flow. A pad control checker may be arranged to perform the following function in a static and dynamic mode, i.e. to check if a pad control protocol is not violated: no illegal states and control signals values. The check may be run after a configuration step is finished by a CPU by enabling the compare result. Alternatively, the check may run continuously if the compare result is always enabled. Each pad which needs this check may be provided with a pad control checker arrangement. Alternatively a pad can have a set of checkers for separate control signals or their combinations.

A pad control checker may have an illegal combination database which describes all illegal combinations or their subsets of the control signals. The configurations may be stored in RAM, ROM, DFFs or hardwired (ties to 1's or 0's).

In the event of an incorrect configuration the error may be reported to a CPU or a dedicated faults management module. The pad configuration is then set to the default value.

Optionally, the device has multiple terminal arrangements and a fault manager unit like the unit 350 as shown in FIG. 3. Respective terminal checkers are arranged for generating respective compare result signals, which are coupled to the fault manager unit. The fault manager unit is arranged for, upon receiving one or more of the compare result signals indicating a not allowed configuration, performing a fault management function.

In practice, for both MUX and PAD control, if one error is detected, a DEFAULT value may be selected. The default value may be configurable or fixed. However, if one pad goes wrong it may be considered a strong enough problem to cause action, e.g. by a CPU which gets the error reported. There may be no further linkage between the terminal checkers.

Optionally, the terminal checker may be arranged for retrieving multiple check configurations from a database. The database may either be internal in the terminal checker, or may be accessible via a bus, or via a further processor.

Optionally, the terminal checker is arranged for receiving and storing the default configuration. A set of registers, or a memory, may be provided in the terminal checker for storing one or more default configurations. A selection of a particular default configuration may be made via a default selection input. Also, the terminal checker may have at least one preset default configuration. Such a preset default configuration may be provided during manufacture or design of the device, e.g. hard wired.

Optionally, the terminal checker comprises at least one aggregated check configuration. The aggregated check configuration defines a combination of multiple configurations of respective multiple terminal drivers that are either allowed or not allowed. Based on such aggregated configurations, a set of terminal checkers may be provided with configuration data, For example, the aggregated check configuration may define a combination of multiple configurations of respective multiple terminal drivers according to a predefined standard, such as the CAN bus. The terminal checker may have a selection input for selecting a specific aggregated check configuration.

Figure 5:
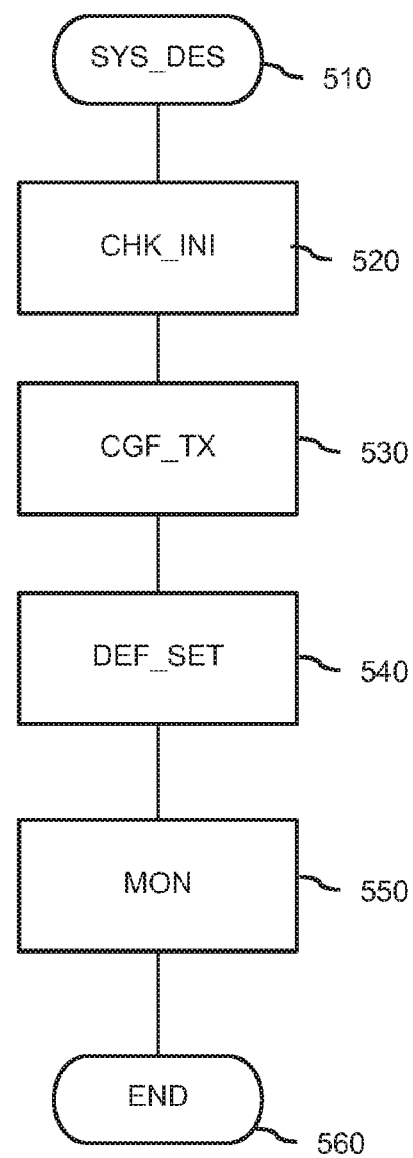
FIG. 5 shows an example of a method of providing a safe mode of operation in a system comprising at least one device having multiplexed input/output terminals.

FIG. 5 shows an example of a method of providing a safe mode of operation in a system comprising at least one device having multiplexed input/output terminals. The method defines control functions implemented for operationally controlling devices as described above, having at least one terminal checker. The method may be implemented in a control unit in such devices, or in a system controller, or may be performed during manufacture, service, or periodically during operational use. First the method assumes that a system configuration is available, e.g. for a car having multiple interconnected devices and operational units, like power steering or brake control. The required terminal configuration for a respective device is thereto to be designed. In a first step SYS_DES 510 the required interconnections via the terminals of one or more devices are designed. Next, in a step CHK_INI 520 a set of check configurations is provided, i.e. at least one check configuration is provided to the respective terminal checker of the device in the system. The check configurations define respective configurations of the terminal driver that are either allowed or not allowed. The check configuration(s) define settings to be verified, which may be either required settings (to be verified to be present) or forbidden or illegal settings, which may not occur during operational use of the device in the respective system. Such sets of settings may be automatically generated based on the required terminal configuration for a respective device, and/or based on further input such as requirements for a system bus to which the device is coupled. The check configurations(s) are transferred to the terminal checker(s), e.g. by storing the check configuration(s) in a memory or registers, or by programming a ROM memory, or wired connections in the device.

Next, a configuration step CFG_TX 530 comprising sending at least one respective terminal configuration to the respective terminal control circuit. Now the device is ready for operational use. After preparing the device for operational use the method may terminate at node END 560.

During operational use, the actual configuration is monitored as indicated by terminal monitoring step MON 550 by comparing the actual configuration to the check configuration(s). The monitoring involves comparing the actual configuration to the at least one check configuration and, when said comparing indicates a not allowed configuration, setting the actual configuration to a default configuration.

Optionally, the method comprises a default setting step DEF_SET 540, which involves defining at least one default configuration of the terminal settings, which is to be used in the event of an error as detected by the terminal checker. The step includes transferring the default configuration to the terminal checker, e.g. sending the default configuration via a system bus or storing the default configuration in a dedicated default register.

Figure 6:
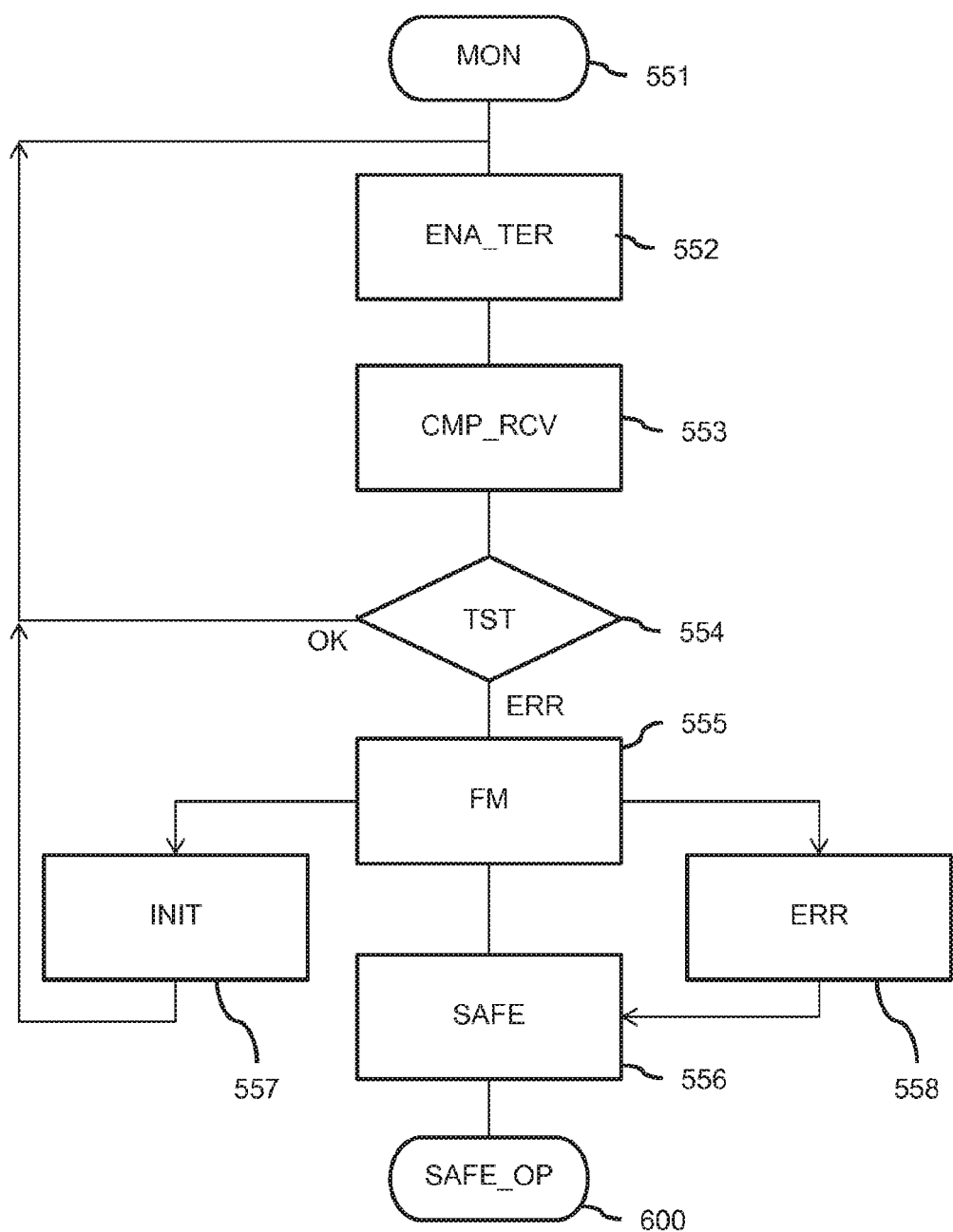
FIG. 6 shows an example of a monitoring method for monitoring whether a device has a safe terminal configuration.

FIG. 6 shows an example of a monitoring method for monitoring whether a device has a safe terminal configuration. The method assumes the device has been prepared for use, e.g. by the method as described with reference to FIG. 5 or by manufacture or a system initialization. During operational use, the method of monitoring provides optional details of step MON 550 above.

The monitoring method starts at node MON 551, and may comprise a terminal checking step ENA_TER 552 that temporarily enables said terminal checker. When the respective terminal checker is enabled, the compare results are outputted by said checker and received for processing in step CMP_RCV 553. In a step TST 554 the receive compare results are evaluated, and, when all compare results indicate allowed configurations, the method continues at step EN_TER for a next cycle. Such cycles may be performed continuously, or at predetermined intervals or according to a schedule. However, upon receiving one or more compare result signals indicating a not allowed configuration, the method detects an error as indicated by the label ERR, and continues by a fault management function in step FM 555 to correct the error, set the system to a safe mode and/or perform error logging. The fault management function may include at least one of the following steps.

The fault management may include a step INIT 557 which performs initialization by (re-) sending the terminal configuration to the terminal control circuit. Normal operation may be then continued at step ENA_TER 552. Such re-initialization may be performed up to a maximum retries, e.g. maximum of 3 retries. Also, the fault management may include specific error handling in step ERR 558, e.g. for correcting some predicted specific errors, for example by correcting the indicated not allowed configuration or detecting repetitive errors. The error handling set ERR may also include storing error data in a log file or register.

The fault management may also include a step SAFE 556 for engaging a safe mode by sending a safe mode terminal configuration to the terminal control circuit. The step SAFE may involve sending a set of multiple terminal configurations to multiple terminals to modify the system to a pre-designed different system having a different configuration, e.g. using different terminals and/or having some reduced functionality, while still providing a safe operation of the system, as indicated by terminal node SAFE_OP 600.

In the foregoing specification, the invention has been described with reference to specific examples of embodiments of the invention. It will, however, be evident that various modifications and changes may be made therein without departing from the broader spirit of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. Furthermore, the units and circuits may be suitably combined in one or more semiconductor devices.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An electronic device, the device comprising:
at least one terminal arrangement to interface internal signals in the electronic device to external signals of other electronic devices via a terminal,
the terminal arrangement comprising the terminal, a terminal driver and a terminal control circuit,
the terminal control circuit including a storage unit to store pad multiplexor configuration data, a pad multiplexor, and a terminal checker including a first section coupled between a storage unit and a pad multiplexor and a second section coupled between the pad multiplexor and pads of the electronic device, the terminal control circuit configured to receive a terminal configuration, the terminal configuration defining properties of the terminal driver, the terminal driver being coupled to the terminal control circuit configured to set an actual configuration of the terminal driver according to the terminal configuration, and the electronic device, the terminal checker configured to compare the actual configuration to at least one check configuration, wherein the comparison between the actual configuration and the check configuration includes: the terminal checker to compare control signals being routed to a pad multiplexor to control signals defined in the check configuration, and to compare electrical properties of pads of the terminal arrangement to electrical properties of the pads defined in the check configuration, the check configuration defining a configuration of the terminal driver that is either allowed or not allowed, and when the configuration of the terminal driver is a not allowed configuration, set the actual configuration to a default configuration.

2. The Device as claimed in claim 1, wherein the terminal checker comprises a pad control checker to compare the actual configuration to at least one pad configuration comprised in the check configuration, the pad configuration defines electrical properties of the terminal driver as experienced by the external signals via the terminal, and when the configuration of the terminal driver is a not allowed configuration, set the actual configuration to a default pad configuration comprised in the default configuration.

3. The Device as claimed in claim 1, wherein the terminal checker comprises a multiplex checker that compares the actual configuration to at least one multiplex configuration comprised in the check configuration, the at least one multiplexing configuration defines multiplexing properties of the terminal driver for coupling at least one of the internal signals to the terminal, and, when said comparing indicates a not allowed configuration, sets the actual configuration to a default multiplexing configuration comprised in the default configuration.

4. The Device as claimed in claim 1, wherein the device comprises multiple terminal arrangements and a fault manager unit, and respective terminal checkers generate respective compare result signals coupled to the fault manager unit arranged that, upon receiving one or more of the compare result signals indicate a not allowed configuration, perform a fault management function.

5. The Device as claimed in claim 4, wherein the fault manager unit performs the fault management function comprising at least one of:

initialization by sending the terminal configuration to the terminal control circuit;

error handling by correcting the indicated not allowed configuration and/or storing error data;

engaging a safe mode by sending a safe mode terminal configuration to the terminal control circuit.

6. The Device as claimed in claim 4, wherein the fault manager unit comprises a processor programmed to perform the fault management function.

7. The Device as claimed in claim 1, wherein the terminal checker comprises a compare enable input that, upon receiving a enable signal, compares the actual configuration and, based thereon, sets the default configuration, and, upon receiving a disable signal, sets the actual configuration of the terminal driver according to the terminal configuration irrespective of whether the configuration of the terminal driver is an allowed configuration.

8. The Device as claimed in claim 1, wherein the terminal checker retrieves multiple check configurations from a database.

9. The Device as claimed in claim 1, wherein the terminal checker receives at least one default configuration and stores the default configuration.

10. The Device as claimed in claim 1, wherein the terminal checker comprises at least one preset default configuration.

11. The Device as claimed in claim 1, wherein the terminal checker comprises at least one aggregated check configuration, the aggregated check configuration defining a combination of multiple configurations of respective multiple terminal drivers that are either allowed or not allowed.

12. The Device as claimed in claim 11, wherein the aggregated check configuration defines the combination of multiple configurations of respective multiple terminal drivers according to a predefined standard.

13. The Device as claimed in claim 11, wherein the terminal checker comprises a selection input to select the aggregated check configuration.

14. The Device as claimed in claim 2, wherein the electrical properties in the pad configuration comprise at least one of Pull Up Enable, which enables either a pull-up or pull-down internal resistor;

Pull Up Select, which selects whether pull-up or pull-down;

Open Drain Enable, which turns off a high side driver so the terminal has only as active low drive;

Slew Rate Enable, which enables a control of rise and fall time of an output signal;

Output Buffer Enable, which makes the terminal an output;

Input Buffer Enable, which enables a digital input buffer.

15. The Device as claimed in claim 1, wherein the terminal checker is arranged to store at least one of said check configurations or default configurations in a RAM memory, in a ROM memory, in a set of flip-flops, or in a predetermined pattern of fixed connections.

16. A method of providing a safe mode of operation comprising:

providing at least one check configuration to a terminal checker during an initialization step, wherein a first section of the terminal checker is coupled between a storage unit and a pad multiplexor, a second section of the terminal checker is coupled between the pad multiplexor and pads of the electronic device, wherein the check configuration includes check control signals to be routed to the pad multiplexor of an electronic device, and check electrical properties of the pads;

sending at least one respective terminal configuration to a terminal control circuit during a configuration step, wherein the respective terminal configuration includes control signals being routed to the pad multiplexor and electrical properties of the pads;

comparing the control signals being routed to the pad multiplexor to the check control signals;

comparing the electrical properties of the pads to the check electrical properties of pads; and determining whether the respective terminal configuration is allowed based on the comparing the control signals being routed to the pad multiplexor to the check control signals, and based on comparing the electrical properties of the pads to the check electrical properties of pads.

17. The Method as claimed in claim 16, wherein the method further comprises sending a default configuration to the terminal checker.

18. The Method as claimed in claim 16, wherein the method further comprises at least one of temporarily enabling said terminal checker and receiving compare results;

upon receiving one or more compare result signals indicating a not allowed configuration, performing a fault management function comprising at least one of:

error handling by correcting the indicated not allowed configuration and/or storing error data;

engaging a safe mode by sending a safe mode terminal configuration to the terminal control circuit.

* * * * *